United States Patent
Heo et al.

(10) Patent No.: US 10,418,580 B2
(45) Date of Patent: Sep. 17, 2019

(54) ORGANIC ELECTROLUMINESCENT DEVICE AND ORGANIC ELECTROLUMINESCENT DISPLAY DEVICE

(71) Applicant: LG Display Co., Ltd., Seoul (KR)

(72) Inventors: Jeong-Haeng Heo, Gyeonggi-do (KR); Jae-Man Lee, Seoul (KR); Jeong-Dae Seo, Incheon (KR); Se-Ung Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/571,547

(22) Filed: Dec. 16, 2014

(65) Prior Publication Data
US 2015/0188074 A1 Jul. 2, 2015

(30) Foreign Application Priority Data
Dec. 30, 2013 (KR) .................. 10-2013-0166477

(51) Int. Cl.
*H01L 51/50* (2006.01)
*H01L 51/52* (2006.01)

(52) U.S. Cl.
CPC ...... *H01L 51/5096* (2013.01); *H01L 51/5044* (2013.01); *H01L 51/5278* (2013.01)

(58) Field of Classification Search
None
See application file for complete search history.

(56) References Cited

U.S. PATENT DOCUMENTS

| | | | |
|---|---|---|---|
| 2004/0247937 A1* | 12/2004 | Chen ................. | C09K 11/06 428/690 |
| 2005/0122038 A1* | 6/2005 | Kinoshita ............ | C09K 11/06 313/504 |

(Continued)

FOREIGN PATENT DOCUMENTS

| CN | 1665353 A | 9/2005 |
|---|---|---|
| CN | 101599535 A | 12/2009 |

(Continued)

OTHER PUBLICATIONS

Lee et al, "Characteristics of Solution-Processed Small-Molecule Organic Films and Light-Emitting Diodes Compared with their Vacuum-Deposited Counterparts," 2009, Adv. Funct. Mater. 19, p. 1625-1630.*

(Continued)

*Primary Examiner* — Shaun M Campbell
*Assistant Examiner* — Aneta B Cieslewicz
(74) *Attorney, Agent, or Firm* — Morgan, Lewis & Bockius LLP

(57) ABSTRACT

An organic electroluminescent device and organic electroluminescent display device having enhanced efficiency are disclosed. The organic electroluminescent device includes first and second electrodes facing each other on a substrate, first and second emission layers formed between the first and second electrodes, a hole transport layer formed between the first electrode and the first emission layer, an electron transport layer formed between the second electrode and the second emission layer, and at least one emission control layer formed between the first and second emission layers and having the same properties as those of at least any one of the hole transport layer and the electron transport layer.

5 Claims, 6 Drawing Sheets

(56) References Cited

U.S. PATENT DOCUMENTS

| | | | |
|---|---|---|---|
| 2007/0013297 A1* | 1/2007 | Park | 313/504 |
| 2009/0146552 A1* | 6/2009 | Spindler | H01L 51/5036 313/504 |
| 2009/0294778 A1 | 12/2009 | Mitsuya | |
| 2011/0133227 A1* | 6/2011 | Lee | H01L 51/5036 257/89 |
| 2015/0243921 A1* | 8/2015 | Nakayama | H01L 51/5044 257/40 |

FOREIGN PATENT DOCUMENTS

| | | |
|---|---|---|
| EP | 1729544 A1 | 12/2006 |
| EP | 1933397 A1 | 6/2008 |
| EP | 2482619 A1 | 8/2012 |
| JP | 2003-086380 A | 3/2003 |
| JP | 2004-207102 A | 7/2004 |
| JP | 2004-235168 A | 8/2004 |
| JP | 2010205427 A | 9/2010 |
| JP | 2011-070963 A | 4/2011 |
| JP | 2012-190618 A | 10/2012 |
| JP | 2012-204092 A | 10/2012 |
| JP | 2012-234733 A | 11/2012 |
| WO | 2008/123178 A1 | 10/2008 |
| WO | 2010/128426 A1 | 11/2010 |

OTHER PUBLICATIONS

Deng et al., Carrier transport in thin films of organic electroluminescent materials, Synthetic Metals, 107, pp. 107-109 (Year: 1999).*
Yu et al., Enhancement of Efficiency and Lifetime of Blue Organic Light-Emitting Diodes Using Two Dopants in Single Emitting Layer, Advances in Materials Science and Engineering, pp. 1-4 (Year: 2012).*
Lee et al., "High-efficiency stacked white organic light-emitting diodes," Applied Physics Letters, 92: 043301 (2008).
Lai et al., "Copper hexadecafluorophthalocyanine and copper phthalocyanine as a pure organic connecting unit in blue tandem organic light-emitting devices," Journal of Applied Physics, 101: 014509 (2007).
Sasabe et al., "Ultra high-efficiency multi-photon emission blue phosphorescent OLEDs with external quantum efficiency exceeding 40%," Organic Electronics, 13: 2615-2619 (2012).
Extended European Search Report issued in counterpart European Patent Application No. 14195154.1 dated Jun. 9, 2015.
Extended European Search Report issued in a corresponding European Patent Application No. 16156485.1, dated May 11, 2016.
Office Action issued in counterpart Chinese Patent Application No. 201410787986.1 dated Jun. 24, 2016.
Office Action issued in counterpart European Patent Application No. 14195154.1 dated Jun. 27, 2016.
Office Action issued in counterpart Japanese Patent Application No. 2014-254069 dated Dec. 1, 2015.
Office Action issued in counterpart Chinese Patent Application No. 201410787986.1 dated Mar. 8, 2017.
Summons to attend Oral Proceedings issued in counterpart European Patent Application No. 14195154.1 dated Apr. 16, 2019.

* cited by examiner

ORGANIC ELECTROLUMINESCENT DEVICE AND ORGANIC ELECTROLUMINESCENT DISPLAY DEVICE

This application claims the benefit of Korean Patent Application No. 10-2013-0166477, filed on Dec. 30, 2013, which is hereby incorporated by reference as if fully set forth herein.

BACKGROUND OF THE INVENTION

Field of the Invention

The present invention relates to an organic electroluminescent device and an organic electroluminescent display device having enhanced efficiency.

Discussion of the Related Art

With the advent of the information era, the field of displays, which visually displays electrical information signals, has rapidly developed. In line with such trends, a variety of ultra-thin and light flat display devices with low power consumption have been developed.

Examples of such flat display devices include, but are not limited to, a liquid crystal display (LCD) device, a plasma display panel (PDP) device, a field emission display (FED) device, and an organic light emitting device (OLED).

In particular, OLEDs are self-emissive and have faster response time, higher luminous efficacy, higher brightness and wider viewing angle than other flat display devices.

A conventional OLED includes a light emitting diode including emission layers to achieve colors. Among these, a blue emission layer has lower luminous efficacy than emission layers that achieve other colors. In addition, the efficiency of a blue mono-diode that achieves a blue color is reduced.

SUMMARY OF THE INVENTION

Accordingly, the present invention is directed to an organic electroluminescent device and an organic electroluminescent display device that substantially obviate one or more problems due to the limitations and disadvantages of the related art.

An object of the present invention is to provide an organic electroluminescent device with enhanced efficiency.

Another object of the present invention is to provide an organic electroluminescent display device with enhanced efficiency.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structures particularly pointed out in the written description and claims hereof as well as the appended drawings.

To achieve these objectives and other advantages and in accordance with the purpose of the invention, as embodied and broadly described herein, an organic electroluminescent device includes first and second electrodes facing each other on a substrate, first and second emission layers formed between the first and second electrodes, a hole transport layer formed between the first electrode and the first emission layer, an electron transport layer formed between the second electrode and the second emission layer, and at least one emission control layer formed between the first and second emission layers and having the same properties as those of at least any one of the hole transport layer and the electron transport layer.

The emission control layer may be formed between the first and second emission layers that achieve the same color and have the same properties as those of the hole transport layer.

Each of the first and second emission layers may include a luminescent host and a luminescent dopant, wherein the luminescent hosts of the first and second emission layers are formed of different materials, and the luminescent dopant of the first emission layer has a lower doping concentration than the luminescent dopant of the second emission layer.

The luminescent host of the first emission layer may have faster hole mobility than the luminescent host of the second emission layer.

The first and second emission layers may achieve a blue color.

The emission control layer may include a first emission control layer formed on the first emission layer and having the same properties as those of the electron transport layer and a second emission control layer formed on the first emission control layer and having the same properties as those of the hole transport layer.

The first emission control layer may have higher electron mobility than hole mobility, and the second emission control layer may have high hole mobility than electron mobility.

Each of the first and second emission control layers may have a thickness of 2 nm to 13 nm, and a total thickness of the emission control layer including the first and second emission control layers may be 4 nm to 15 nm.

The first emission layer may achieve a red color, and the second emission layer may achieve a blue color.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 1:
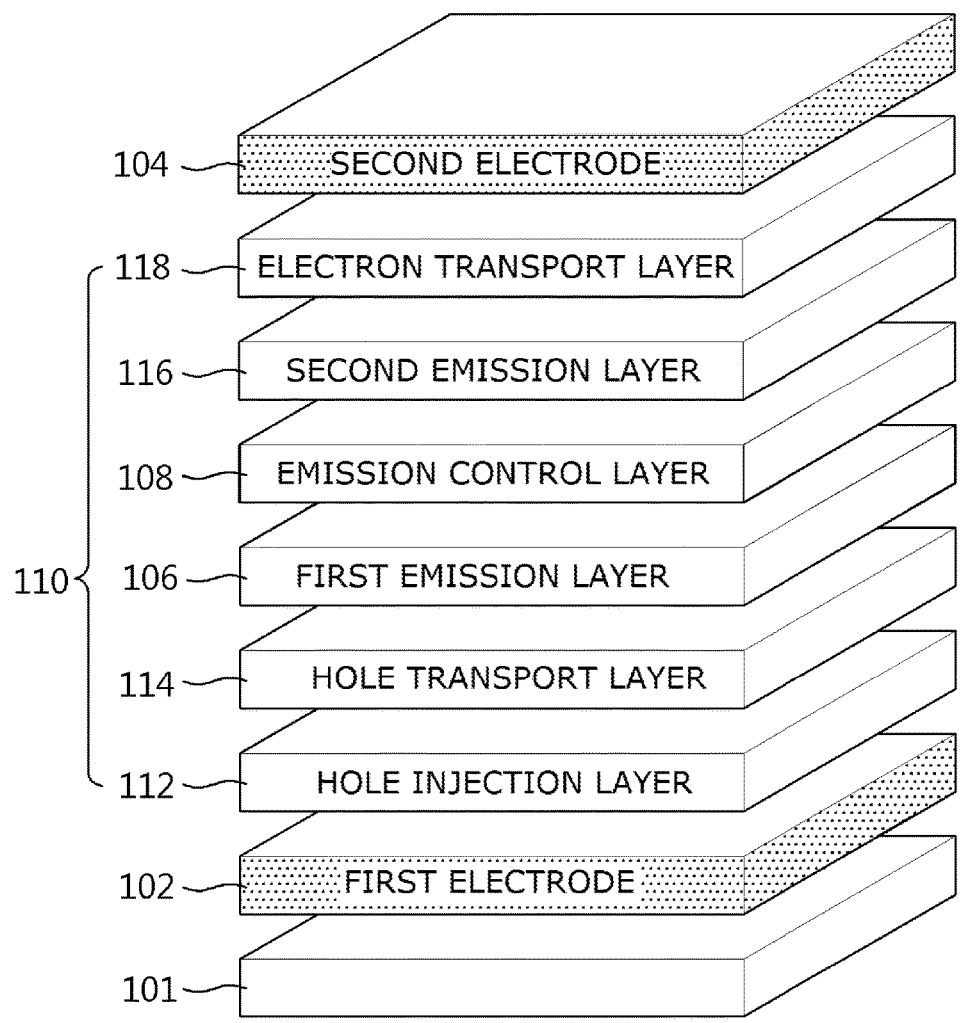
FIG. 1 is a perspective view of an organic electroluminescent device according to a first embodiment of the present invention.

FIG. 1 is a perspective view of an organic electroluminescent device according to a first embodiment of the present invention.

As illustrated in FIG. 1, the organic electroluminescent device includes first and second electrodes 102 and 104 and an organic emission layer 110 formed between the first and second electrodes 102 and 104.

Any one of the first and second electrodes 102 and 104 is formed as a transparent electrode or a semi-transparent electrode, and the other thereof is formed as a reflective electrode. When the first electrode 102 is a semi-transparent electrode and the second electrode 104 is a reflective electrode, the organic electroluminescent device is of a bottom emission type that emits light to the lower side. When the second electrode 104 is a semi-transparent electrode and the first electrode 102 is a reflective electrode, the organic electroluminescent device is of a top emission type that emits light to the upper side. In the present invention, a case in which the first electrode 102 as an anode is formed as a reflective electrode and the second electrode 104 as a cathode is formed as a semi-transparent electrode will be described by way of example.

The first electrode 102 has a multilayer structure including a metal layer formed of aluminum (Al) or an Al alloy (e.g., AlNd) and a transparent layer formed of indium tin oxide (ITO), indium zinc oxide (IZO), or the like and acts as a reflective electrode.

The second electrode 104 is formed as a single layer or multiple layers, and each layer constituting the second electrode 104 is formed of a metal, an inorganic material, a mixture of metals, a mixture of a metal and an inorganic material, or a mixture thereof. In this regard, when each layer is formed of the mixture of a metal and an inorganic material, a mix ratio thereof is 10:1 to 1:10. When each layer is formed of the mixture of metals, a mix ratio thereof is 10:1 to 1:10. The metal constituting the second electrode 104 may be Ag, Mg, Yb, Li, or Ca, the inorganic material constituting the second electrode 104 may be $Li_2O$, CaO, LiF, or $MgF_2$, and the metal and the inorganic material facilitate migration of electrons and thus enable a large number of electrons to be supplied to the organic emission layer 110.

A hole injection layer 112, a hole transport layer 114, a first emission layer 106, an emission control layer 108, a second emission layer 116, and an electron transport layer 118 are sequentially formed between the first and second electrodes 102 and 104.

The hole injection layer 112 serves to facilitate injection of holes from the first electrode 102. The hole injection layer 112 may be formed of at least one of the compounds represented by Formula 1 below, but embodiments of the present invention are not limited thereto.

[Formula 1]

The hole transport layer 114 supplies holes from the hole injection layer 112 to the first and second emission layers 106 and 116. The hole transport layer 114 may be formed of at least one of the compounds represented by Formula 2 below, but embodiments of the present invention are not limited thereto.

[Formula 2]
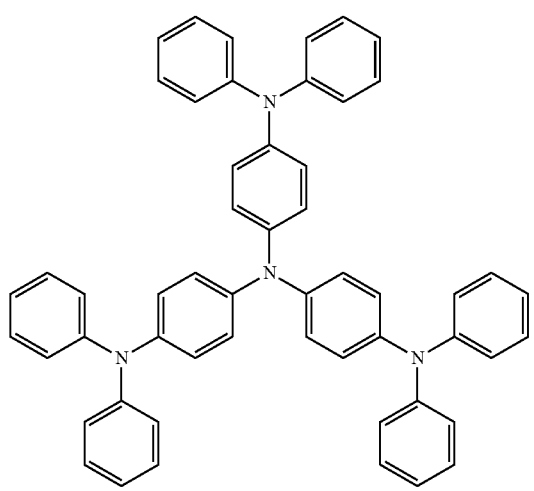
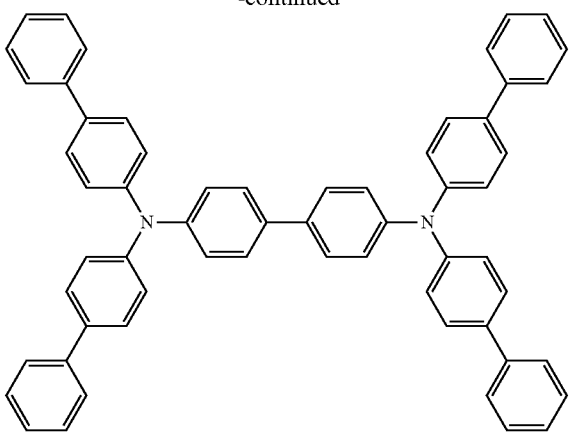
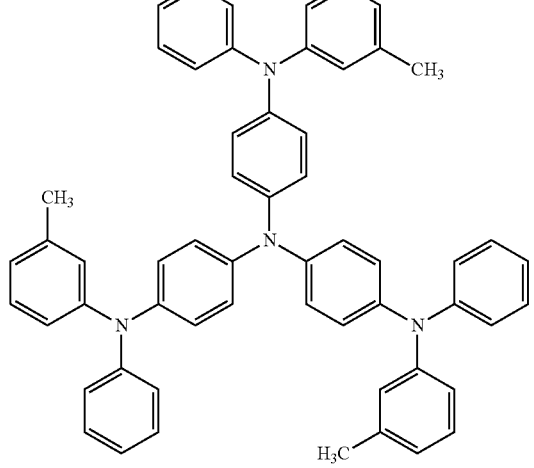
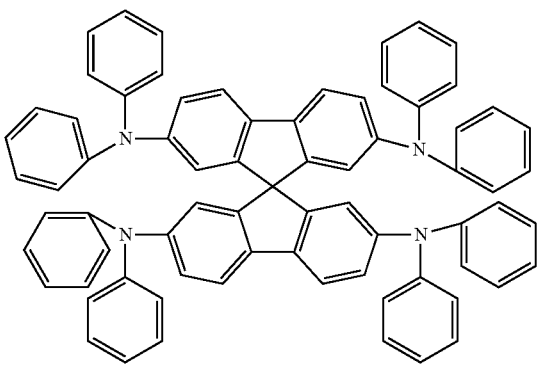
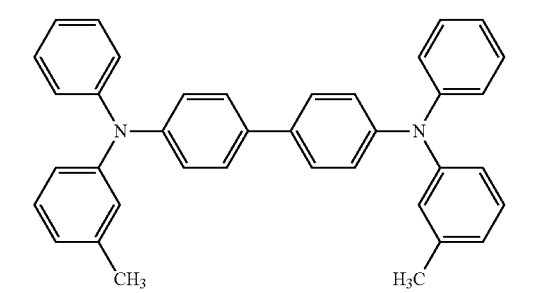
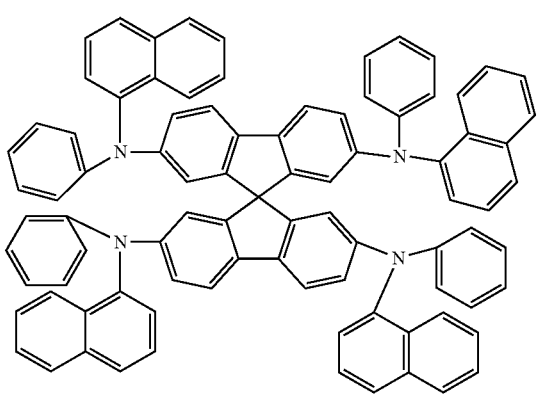
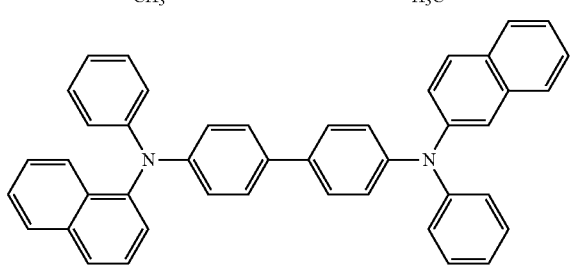
The electron transport layer 118 supplies electrons from the second electrode 104 to the first and second emission layers 106 and 116. The electron transport layer 118 may be formed of at least one of the compounds represented by Formula 3 below, but embodiments of the present invention are not limited thereto.

[Formula 3]

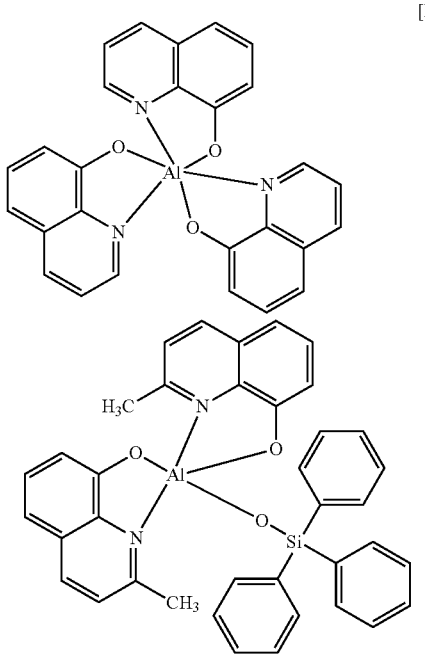

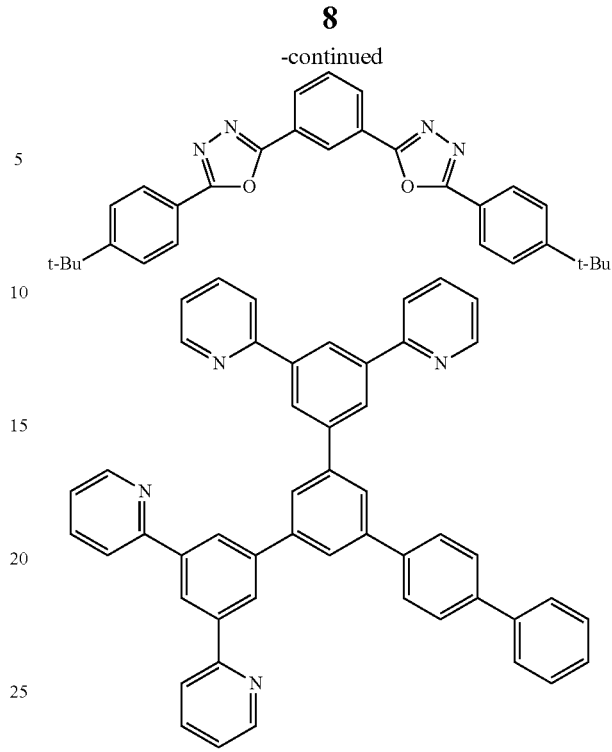

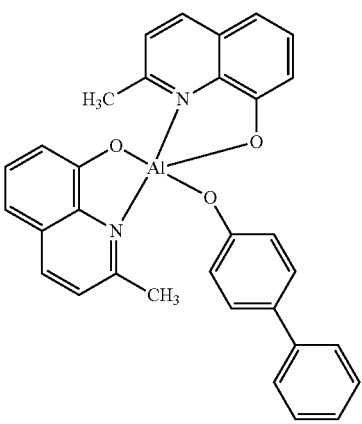

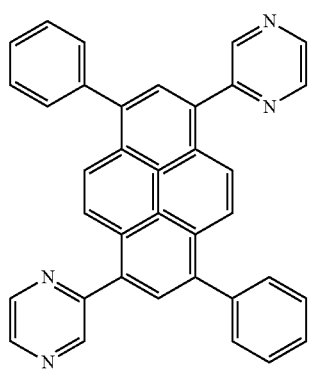

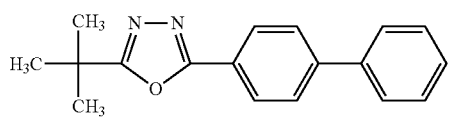

Figure 2:
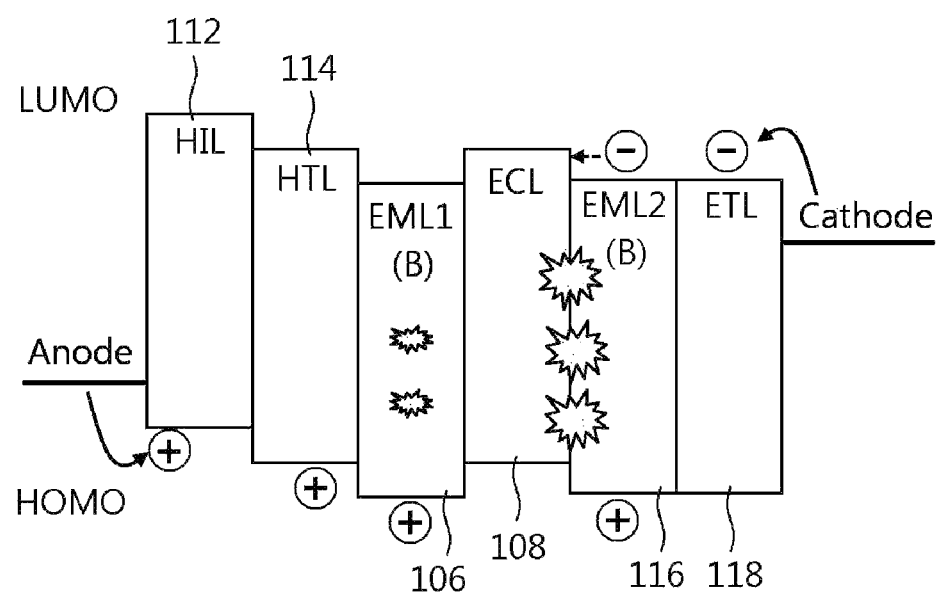
FIG. 2 is a view illustrating an energy level of each of elements included in the organic electroluminescent device of FIG. 1.

The emission control layer 108 is formed between the first and second emission layers 106 and 116. As illustrated in FIG. 2, the emission control layer 108 has a lowest unoccupied molecular orbital (LUMO) energy level that is higher than that of the first and second emission layers 106 and 116 and a highest occupied molecular orbital (HOMO) energy level that is lower than that of the first and second emission layers 106 and 116. For example, the emission control layer 108 has LUMO and HOMO energy levels that are similar or the same as those of the hole transport layer 114. Accordingly, electrons transported via the electron transport layer 118 are unable to migrate towards the first emission layer 106 due to energy barrier between the second emission layer 116 and the emission control layer 108 and are concentrated at an interface between the emission control layer 108 and the second emission layer 116.

The emission control layer 108 may be formed of the same material as that of the hole transport layer 114 so as to have the same hole mobility as that of the hole transport layer 114, or may be formed of a different material than that of the hole transport layer 114 so as to have higher hole mobility than the hole transport layer 114. That is, the emission control layer 108 has the same or higher hole mobility than the hole transport layer 114. Accordingly, holes transported via the hole transport layer 114 are not concentrated at an interface between the emission control layer 108 and the first emission layer 106 and migrate towards the second emission layer 116.

The holes supplied via the hole transport layer 114 and the electrons supplied via the electron transport layer 118 are recombined in the first and second emission layers 106 and 116, thereby emitting light. The first and second emission layers 106 and 116 achieve the same color and are formed of a material having the same optical properties. For example, the first and second emission layers 106 and 116 are formed as a blue emission layer that achieves a blue color or as a phosphorescent blue emission layer that achieves a blue color.

Each of the first and second emission layers 106 and 116 includes a luminescent host and a luminescent dopant.

The luminescent hosts of the first and second emission layers 106 and 116 are formed of different materials. That is, the luminescent host of the first emission layer 106 has faster hole mobility than the luminescent host of the second emission layer 116 and is formed of a material having the same or superior performance to the hole transport layer 114. For example, the luminescent host of the second emission layer 116 has a hole mobility of $1.0 \times 10^{-10}$ to $1.0 \times 10^{-7}$ cm$^2$/Vs, and the luminescent host of the first emission layer 106 has a hole mobility of $4.9 \times 10^{-4}$ to $1.0 \times 10^{-7}$ cm$^2$/Vs. Accordingly, the first emission layer 106 may smoothly move holes from the hole transport layer 114 to the emission control layer 108.

When the first and second emission layers 106 and 116 are formed as blue emission layers, the luminescent hosts of the first and second emission layers 106 and 116 may be formed of at least any one of the compounds represented by Formula 4 below, but embodiments of the present invention are not limited thereto.

[Formula 4]

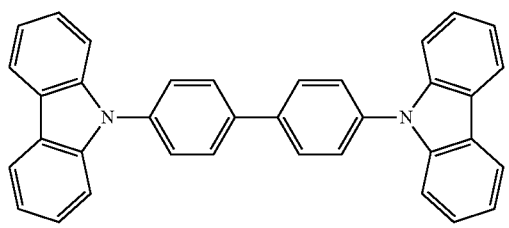

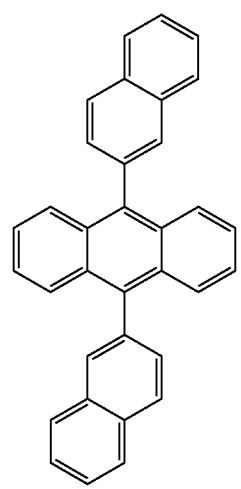

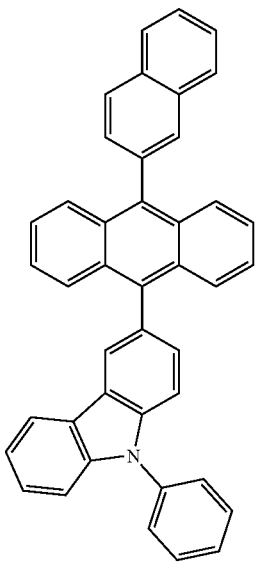

The luminescent dopants of the first and second emission layers 106 and 116 are formed of the same or different materials.

When the luminescent dopants of the first and second emission layers 106 and 116 are formed of the same material, the luminescent dopant of the first emission layer 106 has a lower doping concentration than the luminescent dopant of the second emission layer 116 in order to reduce hole trapping performance of the first emission layer 106. For example, the luminescent dopant of the first emission layer 106 has a doping concentration of 0.5 weight % to 1 weight %, and the luminescent dopant of the second emission layer 116 has a doping concentration of 4 weight % to 6 weight %.

When the luminescent dopants of the first and second emission layers 106 and 116 are formed of different materials, the luminescent dopant of the second emission layer 116 is formed of a material having higher luminous efficacy than the luminescent dopant of the first emission layer 106.

Accordingly, as illustrated in FIG. 2, holes concentrated at an interface between the emission control layer 108 and the second emission layer 116 including a luminescent dopant having a relatively high doping concentration or high luminous efficacy and electrons supplied via the electron transport layer 118 are recombined at the interface therebetween and thus relatively strong light is emitted. In addition, some holes and electrons having passed through the emission control layer 108 are recombined in the first emission layer 106 having a relatively low doping concentration or low luminous efficacy and thus relatively weak light is emitted.

Meanwhile, when the first and second emission layers 106 and 116 are blue emission layers, the luminescent dopants of the first and second emission layers 106 and 116 may be formed of at least one of the compounds represented by Formula 5 below, but embodiments of the present invention are not limited thereto.

[Formula 5]

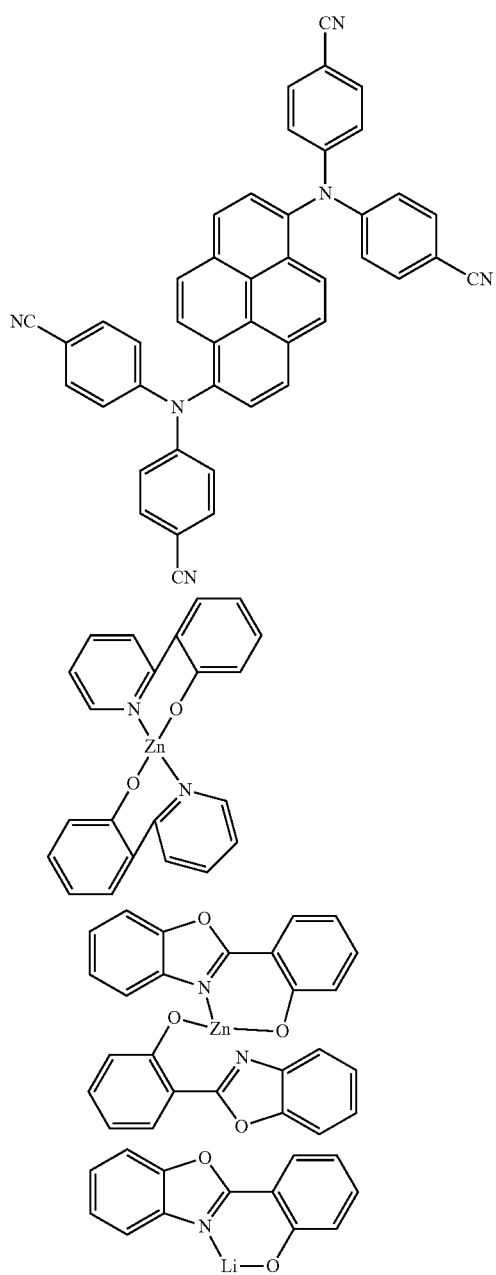

Table 1 shows characteristics of organic electroluminescent devices according to Example 1 and a Comparative Example.

TABLE 1

|  | Voltage | CIE$_x$ | CIE$_y$ | EQE(%) |
|---|---|---|---|---|
| Comparative Example | Identical | Identical | Identical | 100% |
| Example 1 |  |  |  | 113% |

In this regard, the organic electroluminescent devices of Example 1 and the Comparative Example have the following structures on a substrate.

Example 1

First electrode/hole injection layer/hole transport layer/first blue emission layer including a first blue host and a blue dopant/emission control layer/second blue emission layer including a second blue host and a blue dopant/electron transport layer/second electrode.

Comparative Example

First electrode/hole injection layer/hole transport layer/blue emission layer/electron transport layer/second electrode (here, the blue emission layer of the Comparative Example is formed of the same material as that of the second blue emission layer of Example 1).

Each layer of the organic electroluminescent devices of Example 1 and the Comparative Example is formed of a compound represented by Formula 6 below.

[Formula 6]

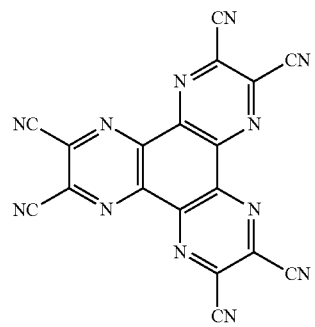

<hole injection layer>

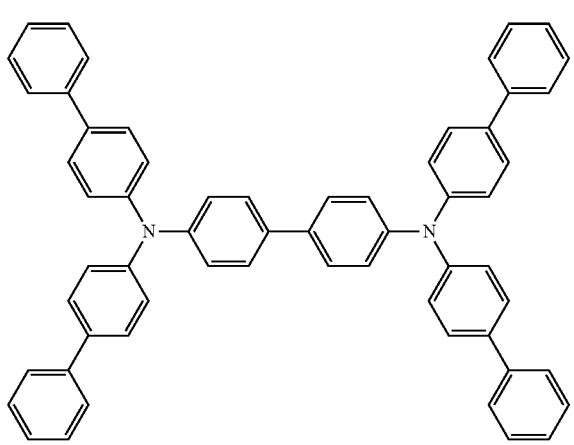

<hole transport layer, emission control layer>

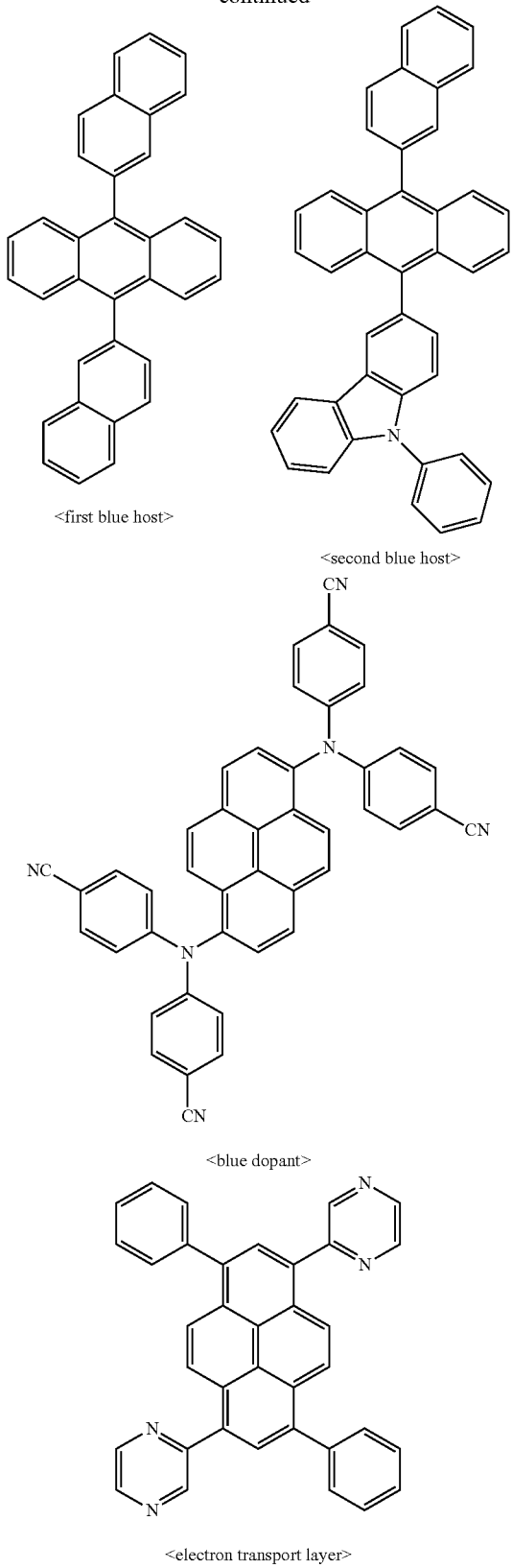

<first blue host>

<second blue host>

<blue dopant>

<electron transport layer>

As shown in Table 1 above, it can be confirmed that the organic electroluminescent device of Example 1 has the same driving voltage and color coordinate characteristics, while having an external quantum efficiency (EQE) increased by 13% or more, when compared to the organic electroluminescent device of the Comparative Example.

Figure 3:
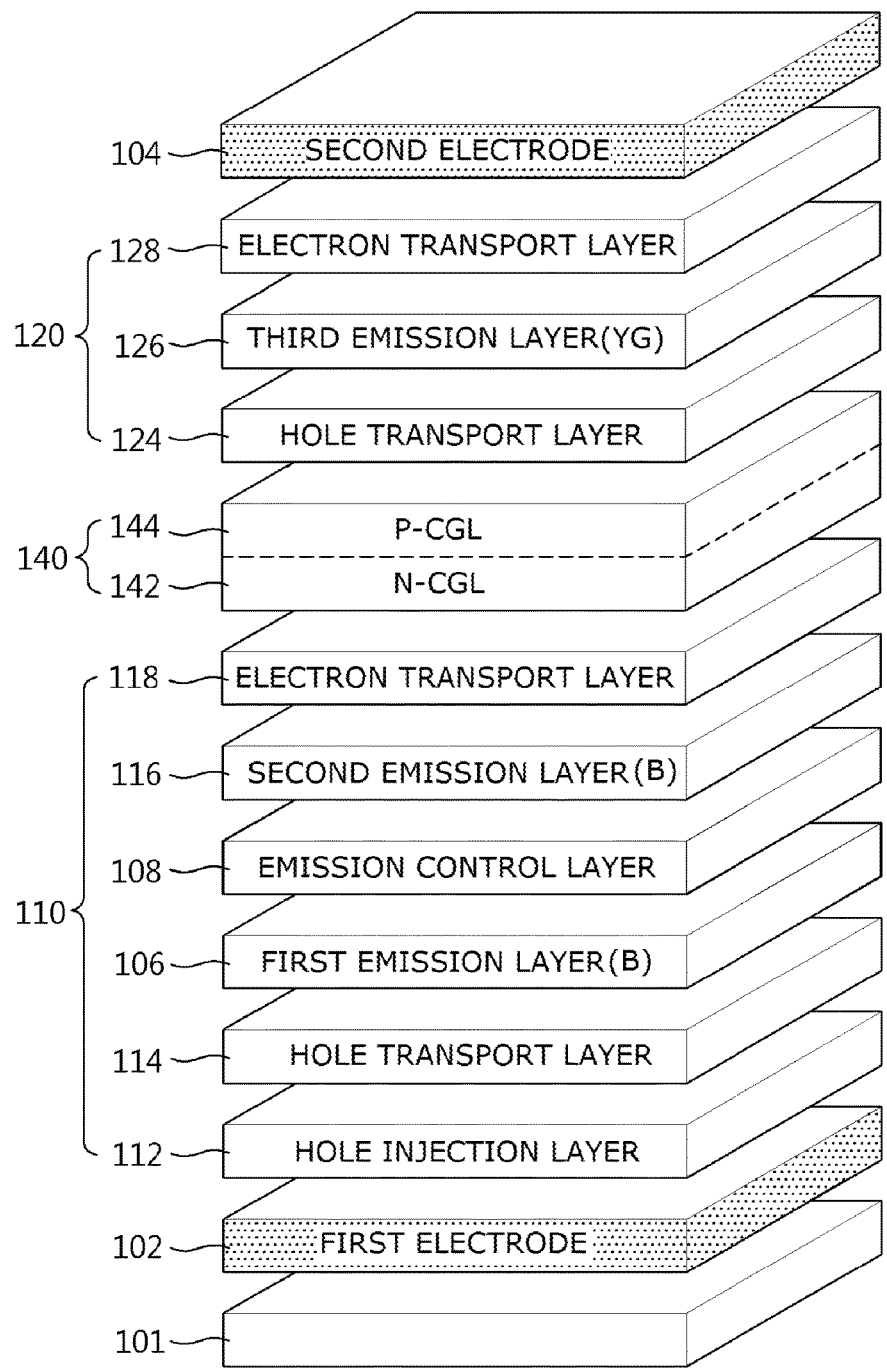
FIG. 3 is a perspective view of an organic electroluminescent device having a multi-stack structure including an emission control layer illustrated in FIG. 1.

Although FIG. 1 illustrates that the organic electroluminescent device has a single light emitting stack structure including the first and second emission layers 106 and 116 that achieve the same color, as illustrated in FIG. 3, the organic electroluminescent device may have a structure including multiple light emitting stacks. That is, the organic electroluminescent device illustrated in FIG. 3 includes first and second light emitting stacks 110 and 120 formed between the first and second electrodes 102 and 104 and a charge generation layer 140 formed between the first and second light emitting stacks 110 and 120.

The charge generation layer 140 is formed between the first and second light emitting stacks 110 and 120 and thus controls charge balance between the first and second light emitting stacks 110 and 120. The charge generation layer 140 includes an N-type charge generation layer 142 and a P-type charge generation layer 144 that are sequentially stacked.

The first light emitting stack 110 is formed between the first electrode 102 and the charge generation layer 140. The first light emitting stack 110 includes the hole injection layer 112, a first hole transport layer 114, the first emission layer 106 that achieves a blue (B) color, the emission control layer 108, the second emission layer 116 that achieves a blue (B) color and a first electron transport layer 118 that are sequentially formed on the first electrode 102.

The second light emitting stack 120 is formed between the second electrode 104 and the charge generation layer 140. The second light emitting stack 120 includes a second hole transport layer 124, a third emission layer 126 that achieves yellow-green (YG) and a second electron transport layer 128 that are sequentially formed on the charge generation layer 140.

The first emission layer 106 includes a blue dopant and a blue host and emits weak blue light, the second emission layer 116 includes a blue dopant having a higher doping concentration than the first emission layer 106 and a blue host and emits strong blue light, and the third emission layer 126 includes a phosphorescent yellow-green dopant and host and emits yellow-green light. Accordingly, white light may be emitted through mixing of blue (B) light of the first and second emission layers 106 and 116 and yellow-green (YG) light of the third emission layer 126.

As such, in the organic electroluminescent device according to the first embodiment of the present invention, the second emission layer 116 emits strong light due to the emission control layer 108 formed between the first and second emission layers 106 and 116. In addition, electrons that are not capable of contributing to light emission of the second emission layer 116 migrate to the first emission layer 106 via the emission control layer 108 and thus are completely used in emission of light from the first emission layer 106 and, consequently, the first emission layer 106 emits weak light. Accordingly, in the organic electroluminescent device according to the first embodiment of the present invention, electrons and holes from the second electrode 104 completely contribute to light emission and thus efficiency is enhanced. In particular, in an organic electroluminescent device that achieves a blue color, efficiency of a blue emission layer is enhanced.

Figure 4:
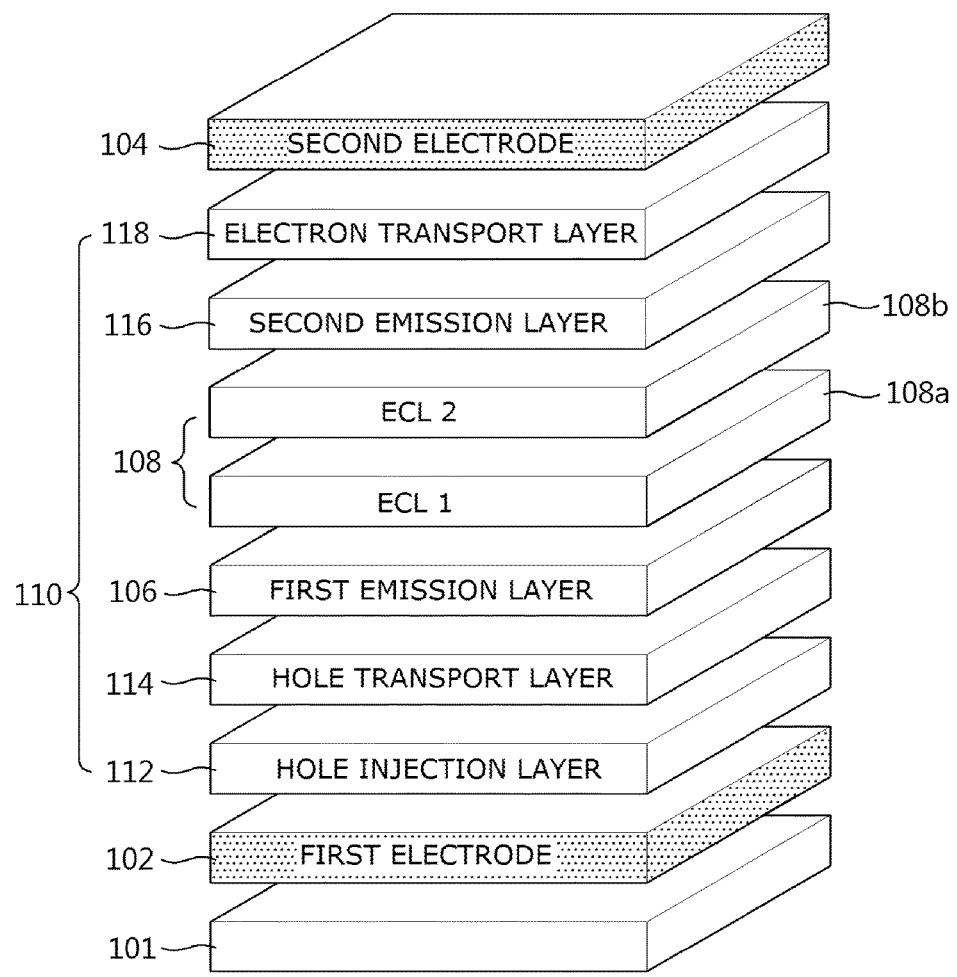
FIG. 4 is a perspective view of an organic electroluminescent device according to a second embodiment of the present invention.
Figure 5:
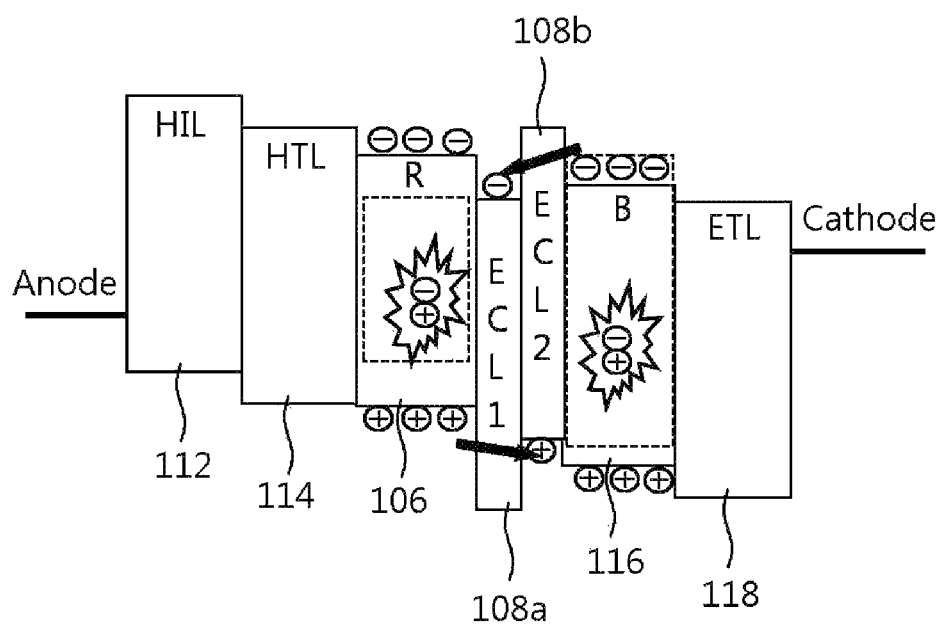
FIG. 5 is a view illustrating an energy level of each of elements included in the organic electroluminescent device of FIG. 4.

FIG. 4 is a view of an organic electroluminescent device according to a second embodiment of the present invention.

The organic electroluminescent device illustrated in FIG. 4 includes the same elements as those of the organic electroluminescent device illustrated in FIG. 1, except that the organic electroluminescent device of FIG. 4 includes multiple emission control layers. Thus, a detailed description of the same elements will be omitted herein.

The multiple emission control layers 108 illustrated in FIG. 4 include first and second emission control layers 108a and 108b formed between the first and second emission layers 106 and 116.

The first emission control layer 108a is formed between the second emission control layer 108b and the first emission layer 106 that achieves a red (R) color. The first emission control layer 108a is formed of a material having higher electron mobility than hole mobility. For example, the first emission control layer 108a is formed of a material having identical or superior properties to those of the electron transport layer 118, as represented in Formula 3 and thus has the same or higher electron mobility than the electron transport layer 118. Accordingly, electrons from the electron transport layer 118 pass through the second emission control layer 108b through tunneling and the electrons having passed through the second emission control layer 108b are transported to the first emission layer 106 via the first emission control layer 108a having excellent electron transporting ability.

The second emission control layer 108b is formed between the first emission control layer 108a and the second emission layer 116 that achieves a blue (B) color. The second emission control layer 108b is formed of a material having higher hole mobility than electron mobility. For example, the second emission control layer 108b is formed of a material having identical or superior properties to the hole transport layer 114, as represented in Formula 2 and thus has the same or higher hole mobility than the hole transport layer 114. Accordingly, holes from the hole transport layer 114 pass through the first emission control layer 108a through tunneling and the holes having passed through the first emission control layer 108a are transported to the second emission layer 116 via the second emission control layer 108b having excellent hole transporting ability.

In addition, the first emission control layer 108a is formed to a thickness of 2 nm to 13 nm so that tunneling of holes occurs, the second emission control layer 108b is formed to a thickness of about 2 nm to about 13 nm so that tunneling of electrons occurs, and a total thickness of the emission control layers 108 including the first and second emission control layers 108a and 108b is 4 nm to 15 nm. When the thickness of each of the first and second emission control layers 108a and 108b exceeds 13 nm, transporting effects of holes and electrons by tunneling may not be obtained. On the other hand, when the thickness of each of the first and second emission control layers 108a and 108b is less than 2 nm, transporting effects of holes and electrons by tunneling may be obtained while it is impossible to obtain intrinsic properties of a material of each layer.

Table 2 shows EQEs of organic electroluminescent devices according to Comparative Examples 1 to 3 and the organic electroluminescent device according to the second embodiment of the present invention.

TABLE 2

| | Comparative Example 1 | | Comparative Example 2 | | Comparative Example 3 | | Example 2 | |
|---|---|---|---|---|---|---|---|---|
| Thickness of ECL1 | 0 nm | | 0.5 nm | | 1 nm | | 2 nm | |
| Thickness of ECL2 | 2 nm | | 1.5 nm | | 4 nm | | 3 nm | |
| EML | Blue | Red | Blue | Red | Blue | Red | Blue | Red |
| EQE | 158% | 3% | 150% | 1.5% | 143% | 4.02% | 100% | 100% |

In this regard, the organic electroluminescent devices of Example 2 and Comparative Examples 1 to 3 have the following structures on a substrate.

Example 2 and Comparative Examples 1 to 3: first electrode/hole injection layer/hole transport layer/first emission layer that achieves a red color/first emission control layer/second emission control layer/blue emission layer that achieves a blue color/electron transport layer/second electrode.

In particular, the first and second emission control layers are formed of a compound represented by Formula 7 below.

[Formula 7]

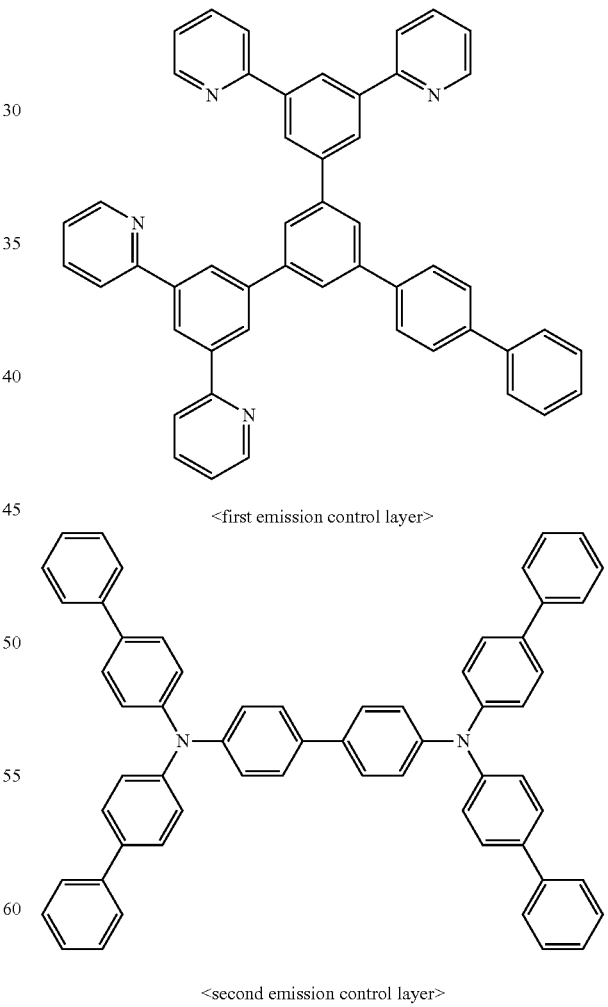

<first emission control layer>

<second emission control layer>

The first and second emission control layers ECL1 and ECL2 of each of the organic electroluminescent devices of Comparative Examples 1 to 3 and Example 2 have the thicknesses shown in Table 2 above.

As shown in Table 2, the blue emission layer of each of the organic electroluminescent devices of Comparative Examples 1 to 3, including the first emission control layer 108 having a thickness of less than 2 nm, has higher EQE than the blue emission layer of the organic electroluminescent device of Example 2, while the red emission layer thereof has much lower EQE than the red emission layer of the organic electroluminescent device of Example 2. This is because the thickness of the first emission control layer 108a is too small and thus the first emission control layer 108a cannot function properly.

Figure 6:
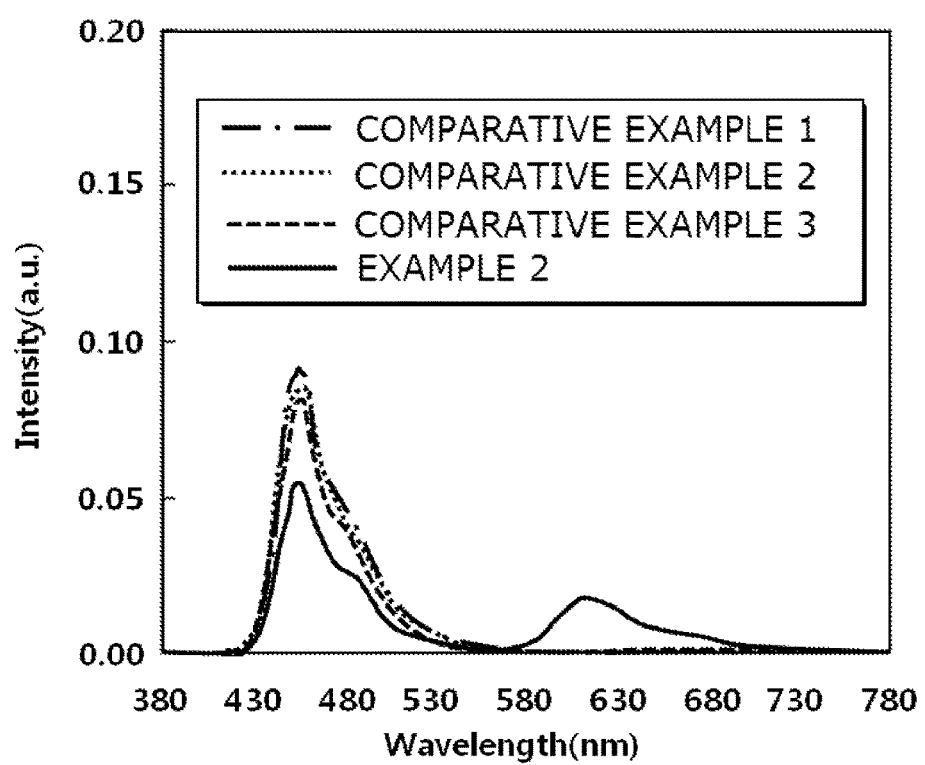
FIG. 6 is a graph showing luminous intensities according to the wavelength of the organic electroluminescent device

Accordingly, as illustrated in FIG. 6, while the organic electroluminescent devices of Comparative Examples 1 to 3 emit light only at a blue wavelength of 410 nm to 500 nm and thus cannot emit white light, the organic electroluminescent device of Example 2 emits light at blue and red wavelengths of 410 to 500 nm and 580 to 700 nm and thus may emit white light through mixing of red light and blue light.

As such, in the organic electroluminescent device according to the second embodiment of the present invention, both the first and second emission layers 106 and 116 emit light due to the first and second emission control layers 108a and 108b formed between the first and second emission layers 106 and 116 and thus efficiency is enhanced.

An organic electroluminescent display device comprising the organic electroluminescent device of FIGS. 1, 3 and 4 has a plurality of thin film transistors electrically connected to first electrode.

As is apparent from the foregoing description, in organic electroluminescent devices according to the present invention, due to at least one emission control layer formed between first and second emission layers, both holes and electrons are transferred to the emission layers and thus luminous efficacy is enhanced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescent device comprising:
an anode and a cathode facing each other on a substrate; and
at least one light emitting stack formed between the anode and the cathode, wherein the light emitting stack comprises:
first and second emission layers formed between the anode and the cathode, where the first emission layer is formed between the anode and the second emission layer, and the second emission layer is formed between the cathode and the first emission layer;
a hole transport layer formed between the anode and the first emission layer;
an electron transport layer formed between the cathode and the second emission layer; and
at least one emission control layer formed between the first and second emission layers which is in contact with the first and second emission layers disposed in a same light emitting stack,
wherein:
each of the first and second emission layers comprises a single luminescent host and a luminescent dopant, where the single luminescent host of the first emission layer is a different compound from the single luminescent host of the second emission layer,
the luminescent dopants of the first and the second emission layers are formed of the same materials, where the luminescent dopant of the first emission layer has a lower doping concentration than the luminescent dopant of the second emission layer,
the luminescent host of the first emission layer has a faster hole mobility than that of the luminescent host of the second emission layer,
the second emission layer emits stronger light than the first emission layer, and
each of the first and second emission layers emits a blue color.

2. The organic electroluminescent device according to claim 1, wherein the emission control layer has the same hole mobility as the hole transport layer.

3. The organic electroluminescent device according to claim 1, wherein a third emission layer emits a yellow-green color.

4. An organic electroluminescent display device comprising:
an anode and a cathode facing each other on a substrate;
a plurality of thin film transistors electrically connected to the anode; and
at least one light emitting stack formed between the anode and the cathode, wherein the light emitting stack comprises:
first and second emission layers formed between the anode and the cathode, where the first emission layer is formed between the anode and the second emission layer, and the second emission layer is formed between the cathode and the first emission layer;
a hole transport layer formed between the anode and the first emission layer;
an electron transport layer formed between the cathode and the second emission layer; and
at least one emission control layer formed between the first and second emission layers which is in contact with the first and second emission layers disposed in a same light emitting stack,
wherein:
each of the first and second emission layers comprises a single luminescent host and a luminescent dopant, where the single luminescent host of the first emission layer is a different compound from the single luminescent host of the second emission layer,
the luminescent dopants of the first and the second emission layers are formed of the same materials, where the luminescent dopant of the first emission layer has a lower doping concentration than the luminescent dopant of the second emission layer,
the luminescent host of the first emission layer has a faster hold mobility than that of the luminescent host of the second emission layer,
the second emission layer emits stronger light than the first emission layer, and
each of the first and second emission layers emits a blue color.

5. The organic electroluminescent device according to claim 4, wherein a third emission layer emits a yellow-green color.

* * * * *